United States Patent [19]
Nicholas et al.

[11] 3,969,744
[45] July 13, 1976

[54] SEMICONDUCTOR DEVICES

[75] Inventors: Keith Harlow Nicholas, Reigate; Ronald Alfred Ford, Crawley, both of England

[73] Assignee: U.S. Philips Corporation, New York, N.Y.

[22] Filed: Dec. 13, 1971

[21] Appl. No.: 207,138

[30] Foreign Application Priority Data
  July 27, 1971  United Kingdom............... 35122/71

[52] U.S. Cl..................................... 357/22; 357/23; 357/91; 148/1.5; 357/41
[51] Int. Cl.².................. H01L 29/80; H01L 29/78; H01L 7/00; H01L 27/02
[58] Field of Search ............... 317/235 (21.1), 48.9; 148/1.5; 357/22, 23, 41, 91

[56]  References Cited
UNITED STATES PATENTS

| | | |
|---|---|---|
| 3,341,754 | 9/1967 | Kellett et al. ....................... 317/234 |
| 3,515,956 | 6/1970 | Martin et al. ....................... 317/234 |
| 3,540,925 | 11/1970 | Athanas et al. ....................... 117/217 |
| 3,653,978 | 4/1972 | Robinson et al. ....................... 148/1.5 |
| 3,700,981 | 10/1972 | Masuhara et al. ....................... 317/235 |

Primary Examiner—Edward J. Wojciechowicz
Attorney, Agent, or Firm—Frank R. Trifari; Jack Oisher

[57]  ABSTRACT

A semiconductor device is described containing at least two insulating gate field effect transistors in a common wafer. One of the transistors exhibits high gain but the other transistor exhibits low gain as a result of selectively implanting into its channel neutral ions and crystal damage which reduce the effective mobility of charge carriers therein. In one embodiment, the low gain transistor serves as a load for the high gain transistor. In a second embodiment, the low gain transistor is a parasitic transistor formed between adjacent circuit elements.

12 Claims, 5 Drawing Figures

SEMICONDUCTOR DEVICES

This invention relates to semiconductor devices, particularly, but not exclusively, to devices comprising a field effect transistor as a circuit element of the device, and further relates to methods of manufacturing such semiconductor devices.

In static logic and other types of circuit, an inverter is frequently used, consisting of an active IGFET (insulated gate field effect transistor) and another IGFET which has its gate connected to drain and acts as a load for the active transistor. For optimum functioning, the gain of the load transistor is preferably less than one fifth, for approximately one tenth, of that of the active transistor. Such a difference in gain is achieved in known devices by having different aspect ratios for the two transistors. Thus, the load transistor is provided with a longer channel than the active transistor. However, it is often desirable to manufacture transistors which have approximately the minimum size obtainable with the semiconductor manufacturing technology employed. If these active and load transistors have different aspect ratios, then they cannot both be of this near minimum size. Thus, the area taken in an integrated circuit body by such an inverter is large, and this reduces the yield of such circuits manufactured from a semiconductor wafer of a certain size. This increases the cost of the devices. Furthermore, the gate capacitance of the load transistor is not as small as that of a minimum area device so that the speed of the inverter is reduced. If it is proposed to reduce the gain by increasing the gate insulator thickness of the load transistor, this will greatly increase the turn-on voltage of this transistor and its power consumption.

In many semiconductor devices a parasitic field effect transistor may be present as a result of parasitic transistor action between two mutually spaced parts of different circuit elements of the device, the conductive channel of the parasitic transistor being induced in the semiconductor body portion between these two parts. The conductive channel can be induced by the presence of appropriate charge states on an insulating layer on the body portion between the said two parts, particularly when an appropriate voltage is applied to a metal layer conductor on the insulating layer over the said body portion. Such parasitic action can provide an undesirable connection between the two different circuit elements and/or result in undesirably large leakage current in the device.

According to a first aspect of the present invention, a semiconductor device comprises a semiconductor body having two mutually spaced circuit element parts adjacent a surface of the body, and a concentration of implanted neutral ions and associated semiconductor crystal lattice damage in at least part of a portion of the body between these two parts, the structure and arrangement of the said two parts and the said portion therebetween being, in the absence of the said concentration, such as to form source and drain parts and a channel portion, respectively, of a field effect transistor, at least one effect of the said concentration being to reduce the gain of this transistor by reducing the effective mobility of charge carriers in that part in which the said concentration is present.

The term "two mutually spaced circuit element parts" is to be understood to include herein two spaced parts of the same circuit element, two spaced parts of different circuit elements and even a part of one circuit element which is spaced from an isolation part which is associated with a circuit element and provides isolation between circuit elements of the device.

The term "channel portion" is to be understood to mean herein the portion of the semiconductor body in which charge carriers would flow in a conductive channel between source and drain of the field effect transistor. This transistor may be a circuit element of the device or may be a parasitic transistor resulting from parasitic transistor action between the said two parts.

The effective mobility is that charge carrier mobility which is derived from measuring the conductivity and the total charge flowing therein.

Neutral ions are ions of electrically inactive impurities which do not substantially influence the concentration of free charge carriers, that is to say, which accept or donate substantially no free charge carriers. They may be of an inert gas, for example neon, or/and, where appropriate, of a Group IV element of the Periodic Table, such as tin, or/and of the semiconductor element, for example silicon. They may even be of an impurity having slight electrical activity, such as nitrogen, for example. These implanted ions may be located at interstitial or substitutional sites in the crystal lattice.

Associated semiconductor crystal lattice damage, for example dislocations, may be termed "radiation damage".

The reduction in charge carrier mobility in the said part appears to be due to increased scattering of the charge carriers by the implanted impurity present, particularly by the radiation damage component of the implanted impurity concentration. By thus reducing the effective mobility and without having to change the channel dimensions, it has been found that the gain of the transistor can be reduced to, for example, a third or even a tenth of the value in the absence of the said implanted impurity.

The said concentration may be present throughout the length of the said portion between the said two parts, or may be present over only a part of this length.

The effective mobility of majority charge carriers in the said part in which the said concentration is present may be at most a third or at most a tenth of the value in the absence of the said concentration. The said effective mobility can be at least one order of magnitude (for example two orders of magnitude) less than the value in the absence of the said concentration. In this way, the gain of the transistor may be reduced by at least one order of magnitude.

In one form, the said field effect transistor results from possible parasitic transistor action between the said two parts, the conductive channel of the parasitic transistor being inducible in the said portion in the absence of the said concentration, the gain of this parasitic transistor being reduced by the presence of the said concentration. In this case, the gain of the parasitic transistor may be reduced to substantially zero by the presence of the said concentration, so as to substantially eliminate the parasitic transistor action.

In another form, the said semiconductor device comprises a circuit element in the form of a field effect transistor of which the said two parts are source and drain parts. The said transistor may be a depletion-mode field effect transistor, the conductive channel of the transistor being present in the said channel portion of the body without any bias being applied to the gate of the transistor; in this case, the said channel portion may be, for example, a dopant diffused or dopant implanted, discrete, channel region of an insulated gate field effect transistor. However, the said transistor may be an enhancement-mode insulated gate field effect transistor the conductive channel of the transistor being formed in the said channel portion of the body in operation of the device, by applying a suitable bias voltage to the insulated gate; in this case, the channel is not present without gate bias.

When the said field effect transistor is a circuit element of the device in the form of an insulated gate field effect transistor, the said implanted impurity may have a peak concentration in a part of the semiconductor body adjacent the insulating layer below the gate electrode, and so in the channel portion of this transistor. By providing the said peak concentration in the channel portion, the reduction in mobility and in gain can be carefully controlled.

The said two parts may be semiconductor regions of the body or/and metal electrodes on the body.

The field effect transistor, when a circuit element of the device, may be connected in the semiconductor device so as to provide the circuit function of a transistor. However, in another form, the gate and drain electrodes of the field effect transistor are connected together so that the said field effect transistor can provide the circuit function of a load. A further field effect transistor may be present and have a channel portion which has substantially the same dimensions and doping as the other field effect transistor but includes substantially no such concentration of implanted neutral ions and associated damage, whereby the gain of this further transistor is greater than that of the said other transistor. In this case, the semiconductor device comprises two field effect transistors having different gains. Thus, the said other transistor can serve as a load for the said further in an efficient inverter circuit, and both transistors may have a size which approaches the minimum area obtainable by the processing employed.

According to a second aspect of the invention, there is provided a method of manufacturing a semiconductor device including the provision of two mutually spaced circuit element parts adjacent a surface of a semiconductor body, the structure and arrangement of these two parts and a portion of the body therebetween being such that they could form source and drain parts and a channel portion, respectively, of a field effect transistor, in which method, neutral ions are implanted in at least part of the said portion of the body, the neutral ion implantation and any subsequent heat treatment being so performed as to provide in the manufactured device in that part of the said portion such a concentration of implanted neutral ions and associated semiconductor crystal lattice damage as to reduce the gain of this transistor to a predetermined value by reducing the effective mobility of charge carriers in that part in which the said concentration is present.

As mentioned hereinbefore, the neutral ions may be of an inert gas, and/or, where appropriate, a Group IV element such as tin, and/or the semiconductor element such as silicon, and/or an impurity having slight electrical activity, such as nitrogen, for example.

The said transistor may be a parasitic transistor or a circuit element of the device. The gain of this transistor and the effective mobility of charge carriers in the said part can be reduced in this manner to the extent mentioned hereinbefore in connection with the first aspect of the invention.

Neon is a particularly suitable neutral ion for certain implantation situations, as it is light enough to penetrate a desirable depth into the semiconductor body, for example through an insulating layer thereon, while being heavy enough to produce appreciable radiation damage at low doses.

The concentration of radiation damage formed by ion implantation is reduced by annealing during a heating treatment. Thus, any heat treatment effected to the semiconductor body at the same time as, and/or subsequent to, the neutral ion implantation is controlled to retain the desired amount of radiation damage which will act as part of the implanted impurity concentration in the manufactured device.

The energy of the neutral ions may be such that the implanted neutral ions have a peak concentration immediately below where the conductive channel of the transistor would be or is formed. The peak radiation damage caused by these implanted neutral ions is produced nearer the surface than the peak ion concentration and so can thus have a peak value where the channel is to be or is formed.

The radiation damage may be partially annealed by heating during the implantation, in which case the implantation is understood to include an annealing treatment. However, an annealing treatment at a low temperature may be employed after implantation; thus, the radiation damage may be partially annealed in a step subsequent to the implantation step, by heating the body at a temperature of at most 500°C, for example.

When the said transistor is a circuit element of the device, there may be provided in the semiconductor body a fuurther field effect transistor which has a higher gain and a channel of substantially the same dimensions and doping, and during the neutral ion implantation in at least part of the channel of the other field effect transistor, an implantation masking layer may be present over the area where this further transistor is to be or is formed.

In addition to implanting neutral ions and associated radiation damage, donor or acceptor ions may be implanted in at least part of the channel portion of the body, for example to change the threshold voltage of the transistor, when this transistor is a circuit element of the device.

In accordance with the present invention, in a method of manufacturing a semiconductor device including a field effect transistor as a circuit element of the device, neutral ions are implanted in a semiconductor body where at least part of the channel of the field effect transistor is to be or is formed, the neutral ion implantation and any subsequent heat treatment being so performed as to provide in the manufactured device in that part of the said channel such a concentration of implanted neutral ions and associated semiconductor crystal lattice damage as to reduce the gain of the transistor to a predetermined value by reducing the effective mobility of charge carriers in that part of the channel.

However, in a method of manufacturing a device in which the field effect transistor is such as could be formed by parasitic transitor action between two parts of the device, the implantation and any subsequent heat treatment may be so performed as to reduce the gain of this parasitic transistor to a minimum.

Embodiments of the first and second aspects of the present invention will now be described, by way of example, with reference to the accompanying diagrammatic drawings, in which.

Figure 1:
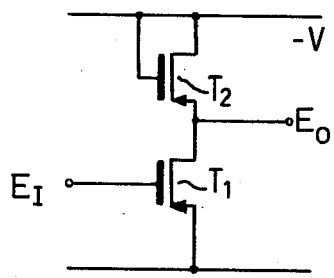
FIG. 1 is part of a circuit diagram showing a MOST inverter in accordance with the present invention.

The inverter shown in FIG. 1 comprises an active enhancement-mode MOST (metal-oxide-silicon-transistor) $T_1$ and another enhancement-mode MOST $T_2$ which has its gate connected to drain and acts as a load. The drain of load transistor $T_2$ is connected to supply line V and its source is connected to the drain of transistor $T_1$ via a common terminal. The output $E_O$ of the inverter is derived from this input terminal. The inverter input $E_I$ is applied to the gate of transistor $T_1$. The gain of the load transistor $T_2$ is less than one tenth of the gain of the active transistor $T_1$.

The inverter shown in FIG. 1 is integrated in a circuit which comprises a semiconductor body 1 having therein source and drain regions 2, 3 and 4 adjoining one major surface 5 of the body 1. The source and drain regions 2, 3 and 4 are high conductivity p-type regions surrounded in the body by a high resistivity n-type body portion which provides the substrate region of the MOS transistors $T_1$ and $T_2$.

The region 2 acts as the source of transistor $T_1$, and the region 4 acts as the drain of transistor $T_2$. The common region 3 acts as both the drain of transistor $T_1$ and the source of transistor $T_2$ and thus provides the direct connection therebetween, shown in FIG. 1.

The surface-adjoining portion of the n-type substrate between the regions 2 and 3 and the regions 3 and 4 constitute respectively the channel portion 11 of the transistor $T_1$ and the channel portion 12 of the transitor $T_2$. These channel portions 11 and 12 are of substantially the same dimensions and have the same donor impurity concentration. At the surface 5 of the body 1, a thin silica layer pattern 6 is present adjacent the group of regions 2, 3 and 4; a thick silica layer pattern 7 extends around the thin pattern 6. At apertures in the thin pattern 6, metal layer electrodes 8, 9 and 10 contact the source and drain regions 2, 3 and 4. A metal layer gate electrode 13 of transistor $T_1$ is located on the thin silica pattern 6 above the channel portion 11. The drain electrode 10 of transistor $T_2$ extends over the thin silica pattern 6 and above the channel portion 12 to form the insulated gate of the transistor $T_2$ connected to the drain. The metal layer electrodes 8, 9, 10 and 13 extend over the thick silica pattern 7 to connect transistors $T_1$ and $T_2$ to other circuit elements of the integrated circuit.

In operation, when a negative voltage is applied to the insulated gate electrodes 13 and 10 of transistors $T_1$ and $T_2$, a "p-type", conductive channel is formed by inversion in the n-type channel portions 11 and 12 between the source and drain regions 2 and 3, and 3 and 4. As stated hereinbefore, the gain of the load transistor $T_2$ is less than one tenth of the gain of the transistor $T_1$. This reduced gain of transistor $T_2$ permits more optimum functioning of the inverter shown in FIGS. 1 and 2.

The reduction in gain of transistor $T_2$ arises from a reduction in effective hole mobility in the "p-type" inversion channel formed in the n-type channel portion 12. This reduced effective hole mobililty is due to the presence in the channel portion 12 of a large concentration of implanted impurity in the form of implanted neon ions and associated silicon crystal lattice damage. The maximum concentration of this implanted impurity occurs in the substrate adjacent the silica layer pattern 6 below the part of the electrode 10 acting as the gate electrode of transistor $T_1$, and thus is where the conductive channel is formed in operation of the device. However, the maximum concentration of the implanted neon ions occurs at a depth of approximately 0.2 microns, immediately below where this channel is formed.

Figure 2:
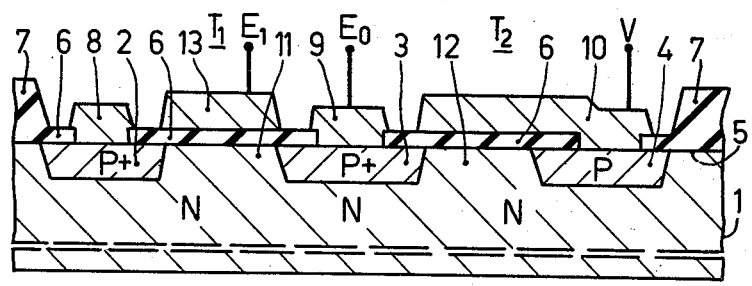
FIG. 2 is a cross-sectional view of the semiconductor body part of the inverter shown in FIG. 1.

The device of FIGS. 1 and 2 can be manufactured in the following manner.

Figure 3:
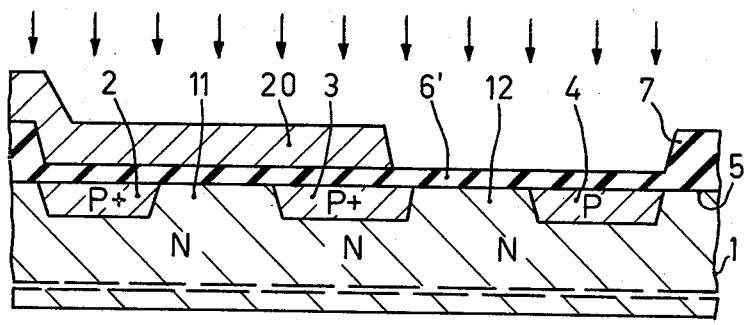
FIG. 3 is a cross-sectional view of the semiconductor body part of FIG. 2 at a stage in the manufacture of the device.

In a conventional manner, source and drain regions 2, 3 and 4 are provided by localised boron diffusion into an n-type silicon body 1, and thick and thin silica layer patterns 7 and 6' are provided on surface 5 of the body 1 using thermal oxidation techniques. As shown in FIG. 3, the thick silica layer pattern 7 has the same structure as in the manufactured device. The thickness of the layer pattern 7 is approximately 1 micron. The thin grown silica layer pattern 6' is in the form of a continuous layer which has a thickness of approximately 1200 A and is present at an aperture in the thick pattern 7 adjacent the group of diffused regions 2, 3 and 4.

A thick metal layer 20 is subsequently provided on the thin pattern 6' above where the transistor $T_1$ is being formed, see FIG. 3. The layer 20 overlaps slightly part of the thick pattern 7. Together with the thick pattern 7, the layer 20 forms an implantation mask which masks the underlying semiconductor, including the channel portion 11, against implantation during a subsequent implantation stage, so that ions are only implanted in the body through the thin silica layer 6' where not covered by the layer 20.

Neon ions having an energy of approximately 100 keV and at an ion dose of the order of $10^{13}$ ions/oc.$^2$ are directed at the whole of the surface 5 of the body, as indicated by arrows in FIG. 3. However, the neon ions are only implanted in the body through the thin silica layer 6' where not covered by the metal layer 20. In this manner, an implanted impurity concentration in the form of implanted neon ions and associated silicon crystal lattice damage is provided in the channel portion 12. Subsequently, the silicon body is subjected to a heat treatment at a low temperature, for example at most 500°C, to partially anneal the lattice damage caused by this implantation. The structure is annealed at this low temperature to control the magnitude of damage retained in the manufactured device as part of the implanted impurity concentration in the channel portion 12.

Subsequently, the metal layer 20 is removed by etching. Contact apertures, are etched in the silica layer 6' to permit contacting of the regions 2, 3 and 4 and to form the silica layer pattern 6 shown in FIG. 2. Subsequently electrodes 8, 9, 10 and 13 are provided in a conventional manner, for example by aluminum deposition and photolithographic and etching techniques. In this way, the structure shown in FIG. 2 is obtained.

Since part of the silica layer 6' through which the ion implantation is effected is retained in the manufactured device, care should be taken during implantation to ensure that this layer part is not damaged to such an extent that the turn-on voltage of the load transistor $T_2$ becomes undesirably large.

Figure 4:
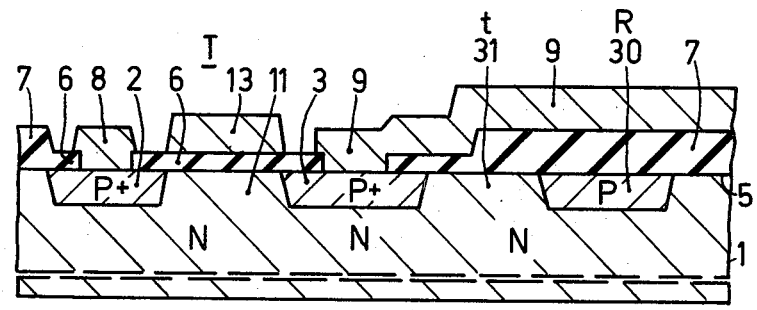
FIG. 4 is a cross-sectional view of a semiconductor body part of an integrated circuit having a parasitic field effect transistor structure of reduced gain.

The integrated circuit of FIG. 4 includes as circuit elements a field effect transistor T and a resistor R, as shown in FIG. 4. The transistor T is similar to the transistor $T_1$ of FIG. 2, and parts of the device of FIG. 4 similar to those of FIG. 1 are denoted by the same reference numerals.

The drain electrode 9 of transistor T extends over thin and somewhat thicker silica layer patterns 6 and 7 and above a p-type resistance region 30 of the resistor R. Particularly when, in operation, a high negative voltage is applied to the drain electrode 9, there is a tendency for a p-type conductive channel to be induced at the surface of the n-type body portion 31 between the drain region 3 of the transistor T and the resistance region 30 of the resistor R. The regions 3 and 30 and the portion 31 thus provide source and drain regions and an intermediate channel portion, respectively, of a parasitic transistor structure $t$ of the device. Conduction through such a channel of such a parasitic transistor $t$ is undesirable, as regards both an undesirable interconnection of the circuit elements T and R and undesirable leakage current in the circuit. Thus, in the device of FIG. 4, the parasitic transistor action is reduced to a minimum by the very low gain provided for the parasitic transistor $t$. This low gain results from the present of a high concentration of implanted neutral ions and associated damage in part of the portion 31 near the drain region 3.

Figure 5:
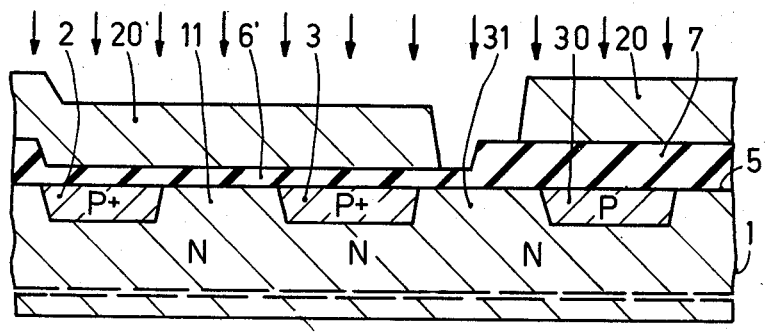
FIG. 5 is a cross-sectional view of the body of FIG. 4 at a stage in the manufacture of the device.

The device of FIG. 4 is manufactured in a conventional manner except that, prior to etching contact windows in the silica layer and providing the electrode interconnections, the body is subjected to neutral ion bombardment in a manner similar to that described in the preceding example. This stage in the present example is illustrated in FIG. 5. A thick metal layer 20 is provided on the silica layer patterns 6' and 7, except above part of the portion 31 near the drain region 3. The metal layer 20 forms an implantation mask which masks the underlying semiconductor against implantation during the neutral ion implantation. In this manner, when neon ions are directed at the surface 5 of the body 1, neon ions are only implanted in the body 1, in the part of portion 31 not covered by either the layer 20 or the silica layer 7. The neon ions have an energy of approximately 100 keV.

In this manner, a high implanted impurity concentration in the form of implanted neon ions and associated silicon crystal lattice damage is provided in part of the portion 31 near the drain region 3.

No annealing treatment may be necessary. However, if desired, the radiation damage may be partially annealed subsequently by heating at a low temperature, for example less than 500°C. The concentration of radiation damage retained is such that, together with the effect of the implanted neon concentration, parasitic transistor action between regions 3 and 30 is substantially eliminated.

It will be evident that many modifications of these devices and methods are possible within the scope of the invention, as defined in the appended Claims. Thus, for example instead of neon ions, ions of tin, silicon or even nitrogen may be implanted.

What we claim is:

1. A semiconductor device comprising a common semiconductor wafer having a body portion of one type conductivity containing at least three spaced surface regions of the opposite type conductivity forming at least two field effect transistors each including a surface channel portion, and means for selectively reducing the gain of one of the field effect transistors, said gain reducing means comprising implanted neutral ions and associated semiconductor crystal lattice damage in the channel portion of said one transistor reducing the effective mobility of charge carriers therein in comparision with the mobility that would have existed in the absence of said implanted ions.

2. A device as claimed in claim 1 wherein the reduction of effective mobility is at least one order of magnitude.

3. A device as claimed in claim 1 wherein both field effect transistors have substantially the same dimensions, and the other field effect transistor has no implanted neutral ions in its channel portion.

4. A device as set forth in claim 3 wherein said one field effect transistor is electrically connected to the other field effect transistor to provide the circuit function of a load for the other transistor.

5. A device as set forth in claim 1 wherein the said one transistor includes a gate electrode on an insulator over the channel portion, and the implanted neutral ions have a peak concentration under the insulator.

6. A device as set forth in claim 1 wherein said one field effect transistor is a parasitic transistor, and its gain is reduced substantially to zero by the implanted neutral ions.

7. A device as set forth in claim 1 wherein the semiconductor is silicon, and the neutral ions are selected from the group consisting of an inert gas, nitrogen, tin and silicon.

8. A method of making a semiconductor device comprising forming in a semiconductor body portion of one type conductivity at least three spaced surface regions of the opposite type conductivity defining at least two channel portions of field effect transistor capable when energized of exhibiting gain, masking the channel portion of one of the field effect transistors against neutral ion implantation, subjecting the body portion to neutral ion bombardment to selectively implant into the channel portion of the other transistor such a concentration of inert ions and associated semiconductor crystal lattice damage to reduce the gain of the associated transistor to a lower value by reducing the effective mobility of charge carriers in said channel portion, and thereafter processing the device so as to retain reduced gain of the other transistor in the final product.

9. A method as set forth in claim 8 wherein the subsequent processing includes heat treatments at a temperature of at most 500°C.

10. A method as set forth in claim 8 wherein the three surface regions are spaced equal distances apart.

11. A semiconductor device comprising a semiconductor wafer having a body portion containing at least two spaced surface regions forming at least one field effect transistor including a channel portion and a conductive gate electrode, and means for selectively reducing the gain of said one field effect transistor, said gain reducing means comprising implanted neutral ions and associated semiconductor crystal lattice damage in the channel portion of said one transistor reducing the effective mobility of charge carriers therein in comparison with the mobility that would have existed in the absence of said implanted ions.

12. A method of making a semiconductor device comprising forming in a semiconductor body portion at least two spaced surface regions defining at least one channel portion of a field effect transistor having a conductive gate above the channel portion and capable when energized of exhibiting gain, subjecting the body portion to neutral ion bombardment to selectively implant into the channel portion of said transistor such a concentration of inert ions and associated semiconductor crystal lattice damage to reduce the gain of the associated transistor to a lower value by reducing the effective mobility of charge carriers in said channel portion, and thereafter processing the device so as to retain reduced gain of the transistor in the final product.

\* \* \* \* \*